US006239862B1

United States Patent
Mulkens et al.

(10) Patent No.: US 6,239,862 B1
(45) Date of Patent: *May 29, 2001

(54) PHOTOLITHOGRAPHIC APPARATUS

(75) Inventors: Johannes C. H. Mulkens; Marinus A. Van Den Brink, both of Eindhoven; Johannes C. M. Jasper, Veldhoven, all of (NL)

(73) Assignee: ASM Lithography B. V., Veldhoven (NL)

(*) Notice: Subject to any disclaimer, the term of this patent is extended or adjusted under 35 U.S.C. 154(b) by 0 days.

This patent is subject to a terminal disclaimer.

(21) Appl. No.: 09/506,343

(22) Filed: Feb. 18, 2000

Related U.S. Application Data

(63) Continuation of application No. 08/833,873, filed on Apr. 10, 1997.

(30) Foreign Application Priority Data

Apr. 10, 1996 (NL) .................................................. 96200936

(51) Int. Cl.[7] ........................... G03B 27/42; G03B 27/54; G03B 27/72; G03B 27/32
(52) U.S. Cl. ................... 355/71; 355/53; 355/67; 355/77
(58) Field of Search ................... 355/71, 53, 67, 355/77

(56) References Cited

U.S. PATENT DOCUMENTS

| | | | |
|---|---|---|---|
| 3,832,029 | * 8/1974 | Bryngdhal | 350/96 T |
| 4,474,463 | * 10/1984 | Heimer | 355/71 |
| 4,918,583 | * 4/1990 | Kudo et al. | 362/268 |
| 5,223,693 | * 6/1993 | Zumoto et al. | 219/212.62 |
| 5,309,198 | * 5/1994 | Nakagawa | 355/67 |
| 5,473,410 | * 12/1995 | Nishi | 355/53 |
| 5,646,715 | * 7/1997 | Wangler | 355/67 |
| 5,675,401 | * 10/1997 | Wangler et al. | 355/67 |
| 5,715,040 | * 2/1998 | Iba | 355/67 |
| 5,854,671 | * 12/1998 | Nishi | 355/53 |
| 6,067,146 | * 5/2000 | Mulkens et al. | 355/71 |

FOREIGN PATENT DOCUMENTS

| | | |
|---|---|---|
| 4106423A1 | 10/1991 | (DE). |
| 0658810A1 | 6/1995 | (EP). |
| WO8401039 | 3/1984 | (WO). |

OTHER PUBLICATIONS

Optics Guide 3, Melles Griot, 1985, Irvine, CA, USA, p. 238/239 XP002017468 "Cube Beamsplitters".

D.A. Markle, "The future and potential of optical scanning systems", Solid State Technology/Sep. 1984, pp. 159–166.

* cited by examiner

Primary Examiner—David M. Gray
Assistant Examiner—Hung Henry Nguyen
(74) Attorney, Agent, or Firm—Pillsbury Winthrop LLP

(57) ABSTRACT

Photolithographic apparatus (1) including an illumination unit (3). The illumination unit (3) comprises, in this order, a radiation source unit (11), a first optical system (5) and an optical waveguide (17). The apparatus (1) further includes a second optical system (7) and a mask table (9). The apparatus (1) is adapted in such a way that both the stepper mode and the scanner mode are selectable modi, and comprises means by which the illumination unit (11), when being operative, has a slit-shaped static illumination field with a width s which is variable between $s_{min}$ and $s_{max}$ while substantially maintaining energy within the static illumination field.

7 Claims, 6 Drawing Sheets

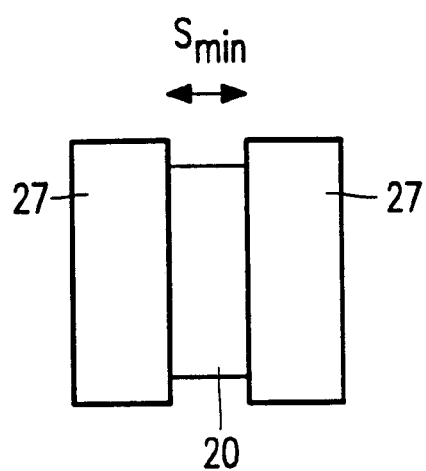
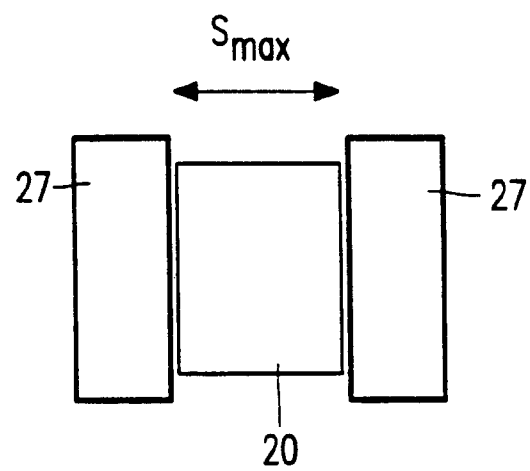
FIG. 3aFIG. 3b
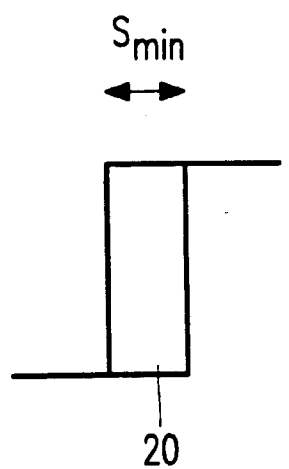
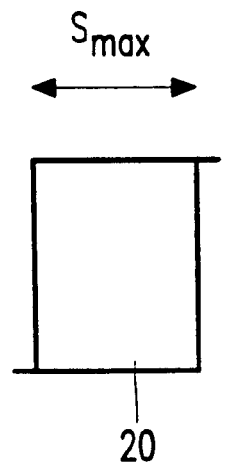
FIG. 5aFIG. 5b

PHOTOLITHOGRAPHIC APPARATUS

This is a continuation of application Ser. No. 08/833,873, filed Apr. 10, 1997 allowed on Nov. 4, 1999, the entire contents of which are herein incorporated by reference.

BACKGROUND OF THE INVENTION

1. Field of the Invention

The invention relates to a photolithographic apparatus for imaging a mask pattern on a substrate and more particularly to a photolithographic apparatus that includes, a radiation source unit, a first optical system, an optical waveguide, and a subsequent second optical system and a mask table.

2. Discussion of Related Art

A photolithographic apparatus of the type described in the opening paragraph is known, for example from European Patent Application EP 0 658 810. Such an apparatus is used for manufacturing integrated circuits (ICs). In this apparatus, a mask provided with a pattern is illuminated and repetitively imaged on a photosensitive layer provided on a semiconductor substrate, for example, a silicon substrate. A large number of integrated circuits (ICs) must be formed on the substrate. After an image of the mask has been formed on the substrate, the substrate is to this end moved with respect to the mask through a distance which is slightly larger than the length or the width of the ICs to be formed, whereafter a subsequent mask image is made. This process is repeated until the desired number of ICs is formed. The apparatus described above is of the stepper type.

In current photolithographic apparatuses, it is desirable that the illumination beam has a maximal intensity so that the illumination period for each IC is as small as possible and the time of passage of the substrate through the apparatus, in other words the time required to illuminate all ICs, is as short as possible. Moreover, the aim is to image on larger fields and to decrease the dimensions of the smallest details to be imaged. Imaging on larger fields may be achieved, for example, by enlarging the projection lens. However, this renders the projection lens very expensive. Another way of imaging on larger fields is to make use of a photolithographic apparatus of the scanner type. In this type of apparatus, the projection lens does not need to be modified. An additional advantage of a scanner is the uniform quality of the image of the smallest details because aberrations caused by the lens are averaged during scanning. A result is that the output of components with structures having critical dimensions is higher.

In a scanner, a field to be illuminated is divided into imaginary sub-fields. Due to a coupled, continuous movement of the mask and the substrate, each time a different part of the mask is projected on the substrate so that the complete field will be illuminated gradually. When a complete field has been illuminated, the substrate is moved in this case through a distance which is larger than the length or the width of the complete field, so that the next field is reached. An example of a photolithographic apparatus of the scanner type is described in the article: "The future and potential of optical scanning systems" by D. A. Markle in Solid State Technology, September 1984, pp. 159–166.

The illumination time per field is longer for a scanner than for a stepper if the field size is the same in both cases. In fact, in a stepper, the illumination time per field is only determined by the available energy. In a scanner, the overscan time is also to be taken into account. Here, the scan time for illuminating the total field is not only determined by the field size but also by the slit width. Namely, there is a given time interval at the start and the end of the field to be illuminated, in which a part of the slit-shaped illumination field is not present above the field to be illuminated. The illumination time and consequently the time of passage of the substrate are thus dependent on the slit width of the illumination beam. However, systems in which a lamp is used as a light source have a relatively low optical efficiency. This is caused by the difference in throughput between the lamp and the slit geometry. In fact, the lamp illuminates light at all angles, while the slit geometry is anamorphous so that the geometry of the radiation field of the lamp deviates to a relatively large extent from the slit geometry.

If the fields are small enough to be illuminated completely with one pulse, a stepper is preferred as far as speed is concerned.

BRIEF SUMMARY OF THE INVENTION

It is an object of the invention to provide a photolithographic apparatus in which the above-mentioned drawbacks relating to scanners and steppers are obviated.

According to the invention, the photolithographic apparatus is characterized in that the apparatus is adapted in such a way that both the stepper mode and the scanner mode are selectable modi, and in that the apparatus comprises means by which the illumination unit, when being operative, has a slit-shaped static illumination field with a slit width s which is variable between $s_{min}$ and $s_{max}$ while substantially maintaining energy within the static illumination field.

The slit width s of the illumination unit is to be understood to mean the width of the static illumination field at the area of the substrate. This static field is formed on the exit face of an optical waveguide and subsequently imaged on the mask by means of an optical system.

The stepper mode is to be understood to mean the mode in which a field is completely illuminated on the substrate by means of one and the same light pulse. The scanner mode is to be understood to mean the mode in which the mask and the substrate perform a coupled movement and the complete field will be fully illuminated after a period of time has elapsed.

Since both the stepper mode and the scanner mode can be selected in the apparatus according to the invention, small as well as large fields on a substrate can be illuminated with the same apparatus, and this at a minimum loss of illumination energy because the slit width is variable. By virtue of the variable slit width, it can thus be ensured that the time of passage is minimized for all slit widths in the scanner mode and for the width of the complete field in the stepper mode.

A preferred embodiment of the photolithographic apparatus according to the invention is characterized in that $s=w$ for $w \leq w_{step}$, and $s_{min} \leq s \leq s_{max}$ for $w > w_{step}$, in which s is the width of the illumination field supplied by the illumination unit, $s_{min}$ and $s_{max}$ are its minimum and maximum values, respectively, w is the width of a field to be illuminated and $w_{step}$ is the maximum width of a field to be illuminated in the stepper mode.

As a result, the slit width has the dimension of the field width if the stepper mode is selected, and the slit width is variable if the scanner mode is selected in order to be able to optimize the time of passage for each field size.

A maximum field width $w_{step}$ is coupled with the stepper mode. If the field to be illuminated has a smaller width than this value, the slit width will be rendered equal to the width of the field to be illuminated. This is possible until a minimum slit width $s_{min}$ is reached. When the scanner mode is selected, in other words, when a field having a width larger than $w_{step}$ is to be illuminated, the slit width will be variable between the values $s_{min}$ and $s_{max}$.

There are different possibilities for realizing an illumination unit having a light beam which is slit-shaped and a slit width which is variable while maintaining energy.

A first embodiment of the photolithographic apparatus according to the invention is characterized in that the optical waveguide comprises at least one optically transparent bar.

The transparent bar has an integrator function. The transparent bar may be made of, for example quartz. In that case, a reflection of more than 99% can be achieved at the side walls of the bar.

A further embodiment of the photolithographic apparatus according to the present invention is characterized in that a slit-shaped diaphragm having a variable aperture is present between the mask table and the end of the optical waveguide facing the mask table.

At the exit face of the optical waveguide, the diaphragm will ensure that a light beam having the desired beam cross-section is generated. The aperture of the diaphragm is adjustable with reference to the information about the field width w to be illuminated.

A further embodiment of the photolithographic apparatus according to the present invention is characterized in that the diaphragm surface facing the optical waveguide is reflective.

A reflective diaphragm has the advantage that the light incident thereon is recuperated and remains in the light path. If the diaphragm were not reflective, a part of the light would immediately be blocked by the diaphragm, resulting in a considerable loss of energy. This embodiment is advantageous especially in the case that the radiation source is a lamp.

A further embodiment of the photolithographic apparatus according to the invention is characterized in that the diaphragm is present in the proximity of the end of the optical waveguide facing the second optical system.

An advantage of this position of the diaphragm is that the back-reflections have a relatively short light path.

Another embodiment of the photolithographic apparatus according to the invention is characterized in that the diaphragm is present in the proximity of the mask table.

A further embodiment of the photolithographic apparatus according to the invention is characterized in that the diaphragm is a REMA.

A reflective diaphragm which is present in the proximity of the exit face of the optical waveguide or in the proximity of the mask may be a REtical MAsking (REMA) system. The function of a REMA is to sharply bound the illuminated field on the mask. Since the same element now has two functions, a smaller number of components will be sufficient.

To be able to determine the opening period of the shutter, hence the illumination time, in the case of a stepper, and the uniformity of the illumination dose through a complete field, in the case of a scanner, and to be able to subsequently optimize, it should be possible to measure the illumination dose which will be incident on the substrate.

To this end, the apparatus is provided with an energy sensor. In principle, this sensor may be present at different positions in the apparatus. In a preferred embodiment, the photolithographic apparatus according to the invention is characterized in that the optical waveguide is constituted by a first optically transparent bar and a second optically transparent bar between which a prism system is enclosed, having an exit face via which light can be coupled out of the prism system, while an energy sensor is present opposite the exit face.

In this case, the optical waveguide consists of two optically transparent bars between which the prism system is present. By giving the prism system an exit face on which a fraction of the light beam is coupled out of the light path, and by arranging an energy sensor opposite this exit face, the illumination dose can be measured in a reliable and reproducible way.

A preferred embodiment of the photolithographic apparatus according to the invention is characterized in that the radiation source is a lamp which is present in a focus of an elliptic mirror, the second focus of the mirror being located in the focal plane of the first optical system and the entrance face of the optical waveguide coinciding with the back-focal plane of the first optical system.

The optical efficiency can be improved by ensuring that the illumination system is confocal in front of the optical waveguide.

A second embodiment of the photolithographic apparatus according to the invention is characterized in that the optical waveguide is an optical tunnel having inner walls which are provided with a reflective material and are movable with respect to each other so that the dimension of the tunnel in a direction transverse to the longitudinal direction is variable.

By varying the dimension of the tunnel perpendicularly to the longitudinal direction, the width of the static illumination field can be adapted. In this case, the walls of the tunnel are moved with respect to each other on the basis of the value of the field width w to be illuminated. In this case, a separate diaphragm is not necessary.

A further embodiment of the photolithographic apparatus according to the invention is characterized in that the focal plane of the first optical system coincides with the entrance face of the tunnel.

In this manner, the light is coupled into the optical tunnel to an optimal extent.

These and other aspects of the invention will be apparent from and elucidated with reference to the embodiments described hereinafter.

BRIEF DESCRIPTION OF THE DRAWINGS

In the drawings:

FIGS. 3a and 3b show examples of the minimum and maximum slit width for the embodiment shown in FIG. 2;

FIGS. 5a and 5b show examples of the minimum and maximum slit width for the embodiment shown in FIG. 4;

DETAILED DESCRIPTION OF THE PREFERRED EMBODIMENTS

Figure 1:
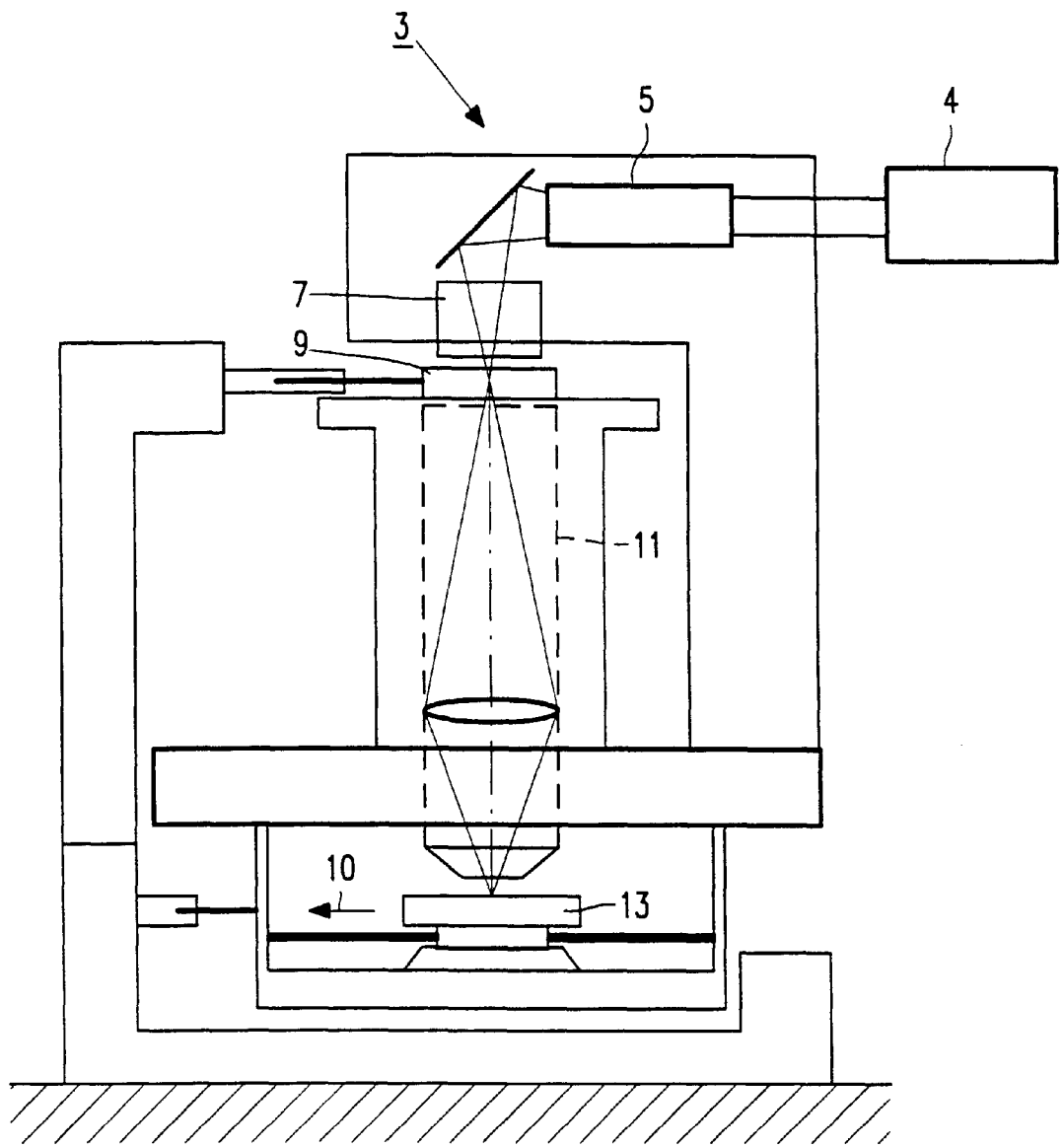
FIG. 1 shows diagrammatically a photolithographic apparatus.

The photolithographic apparatus 1 shown diagrammatically in FIG. 1 comprises a radiation source unit 4 for supplying an illumination beam which is incident on a mask table 9 via a first optical system 5 and a second optical system 7. When a mask (not shown) is present on the mask table 9, it can be imaged by means of a projection lens system 11 on a substrate (not shown) which is present on a substrate table 13. The substrate may be, for example, a silicon substrate provided with a photosensitive layer. The location on the substrate where the pattern is imaged is referred to as a field. In this way, integrated circuits (ICs) can be formed on the substrate.

There are two types of photolithographic apparatuses hitherto known: the stepper type and the scanner type.

In a stepper, a complete field is illuminated simultaneously. After the illumination of a field, the substrate is moved across an accurately defined distance which is larger than the length or the width of the field, for example, in the direction of the arrow 10, whereafter the pattern can be imaged on a subsequent substrate field. This process is repeated until the pattern has been imaged on the desired substrate fields.

A scanner is generally used if imaging on larger substrate fields is desired. The field to be illuminated can be divided into imaginary sub-fields. By means of a coupled, continuous movement of the mask and the substrate, each time a different part of the mask is projected on the substrate, so that the complete field is illuminated gradually. When a complete field has been illuminated, the substrate is moved across an accurately defined distance which is larger than the length or the width of the total field to be illuminated.

For a photolithographic apparatus of the scanner type, it holds that:

$$T=(1+w/s)D/I$$

in which T is the illumination time, s is the slit width, w is the width of the field to be illuminated, D is the desired illumination dose and I is the intensity of the radiation incident on the slit having the width s. The intensity I depends on the optical efficiency of the illumination unit and the projection lens system which is used to image the mask on the substrate, which efficiency in turn depends on the slit width s.

For a photolithographic apparatus of the stepper type, it holds that:

$$T'=D/I'$$

in which T', D and I' have a significance in conformity with T, D and I in the case of a scanner.

For the same size of the field, the illumination time for this field will be larger in a scanner than in a stepper, due to the overscan time in a scanner. If, for an equal illumination dose, it is desired that T<T', i.e. in order that for an equal illumination dose D the illumination time of a scanner should be shorter than that of a stepper, it should hold that I>I'(1+w/s).

For a given radiation power P, the intensity is defined by:

$$I=(P\times\eta)/(h\times s)$$

for a scanner, and $$I'=(P\times\eta')/(h\times w)$$

for a stepper, in which h is the height of the field to be illuminated, s is the slit width, w is the width of the field to be illuminated and $\eta$ and $\eta'$ denote the optical efficiency of a scanner and a stepper, respectively.

Starting from the requirement that T<T', it follows from the above relations that, at an equal radiation power P and an equal illumination dose D:

$$\eta>\eta' (1+s/w)$$

applies as a requirement for the optical efficiency of a scanner relative to the optical efficiency of a stepper.

However, since the aperture of a scanner is relatively small and anamorphous, the optical efficiency $\eta$ of a scanner will generally be lower than the optical efficiency $\eta'$ of a stepper, because the geometry of the slit deviates to a relatively large extent from the geometry of the radiation field of the radiation source, particularly if the radiation source is a lamp. This means that it is advantageous to make use of the scanner mode, particularly for larger field dimensions. If the fields are small enough to be illuminated by means of a single pulse, a stepper is preferred.

The invention allows selection between the stepper mode and the scanner mode, dependent on the size of the field to be illuminated, such that the energy within the illumination field is maintained substantially constant for all field sizes in any one of the modi. The invention is based on the recognition that an apparatus having a relatively high optical efficiency can be realized by determining the operation mode of the apparatus on the basis of the width w of the field to be illuminated and by optimizing the slit width s for each mode.

The optical efficiency $\eta$ for the scanner mode and the optical efficiency $\eta'$ for the stepper mode are thus both optimized in the same apparatus. This is achieved by generating a slit-shaped illumination field with a variable slit width, while taking measures in such a way that substantially all the light is concentrated in the slit-shaped illumination field or by ensuring that the light which does not pass through the slit is recuperated and given a chance to fall within the slit again. In this way, the energy within the illumination field is maintained substantially constant for all slit widths within any one of the modes.

If the field width w of the field to be illuminated is smaller than or equal to the maximum field width $w_{step}$, in other words, the field width which can be illuminated with a stepper, then the slit width s should be equal to the field width w of the field to be illuminated. For the stepper mode, the slit width may thus be selected with reference to the desired field width until the minimum slit width is reached. If the field width w to be illuminated is larger than $w_{step}$ and, consequently, the scanner mode is to be used, it should hold for the slit width s that $s_{min} \leq s \leq s_{max}$.

The above-mentioned conditions for the slit width s and the field width w may be realized in different manners.

Figure 2:
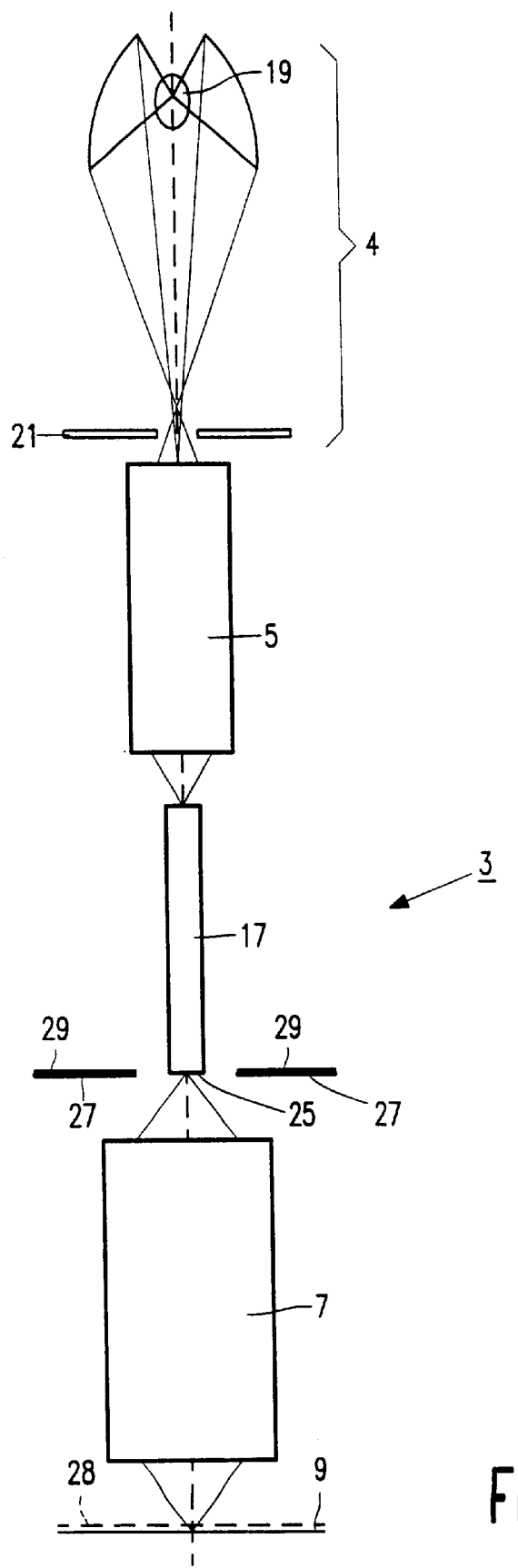
FIG. 2 shows, in detail, a first embodiment of a part of a photolithographic apparatus according to the invention.

FIG. 2 shows diagrammatically a part of an embodiment of an apparatus according to the invention. The radiation source unit 4 comprises the radiation source 19 and a shutter 21. The radiation source may be, for example, a mercury lamp in combination with an elliptic mirror, but may alternatively be, for example, an excimer laser. In the apparatus according to the invention, an optical waveguide 17 is arranged between the first optical system 5 and the second optical system 7. The second optical system images the exit face 25 of the optical waveguide at the area of the mask table 9, particularly on the mask (not shown).

In the embodiment shown in FIG. 2, the optical waveguide is constituted by an optically transparent bar. The optically transparent material may be, for example quartz. Such a bar has an integrator function so that the distribution of light at the exit face 25 of the optical waveguide 17 is relatively homogeneous. If quartz is used, a reflection of more than 99% at the side walls of the optical waveguide may be achieved. Moreover, a diaphragm 27 is arranged proximate to this exit face 25. The aperture of this diaphragm is variable in size in the direction in which scanning takes place. In this manner, an illumination unit is realized in which the generated static illumination field has a slit-shaped cross-section. By varying the aperture of the diaphragm 27, the slit width s is consequently also varied.

If the illumination unit 3 is provided with a REMA, ensuring that the illuminated field at the area of the mask is relatively sharply bounded, the REMA may function as a diaphragm.

Instead of being arranged in the proximity of the exit face 25, the diaphragm may also be present in the proximity of the mask table 9. Since this is an alternative possibility, the diaphragm, denoted by the reference numeral 28 in this case, is shown by way of a broken line. The apparatus is thus provided with either a diaphragm 27 or a diaphragm 28. If the apparatus also includes a REMA, the REMA may function as a diaphragm in both cases. The diaphragm function and the REMA function are combined in a single component in this case. Another possibility is to arrange the REMA in the proximity of the exit face 25, if the apparatus is provided with a diaphragm 28, or to arrange the REMA in the proximity of the mask if the apparatus is provided with a diaphragm 27. In the two last-mentioned possibilities, the REMA function and the diaphragm function are separate functions.

The surface of the diaphragm 27 facing the optical waveguide 17, or the surface of the diaphragm 28 facing the optical system 7, is provided with a reflective layer 29 for recuperating light, whereby the optical efficiency is improved. If this were not the case, the provision of the diaphragm would result in the formation of a slit-shaped illumination field, but with the result of a considerable loss of energy. In fact, the light which is incident on the diaphragm would be blocked instead of being recuperated.

FIGS. 3a and 3b are cross-sections taken in the longitudinal direction of the transparent bar 17 of FIG. 2 at the location of the diaphragm 27 or 28. In FIG. 3a, the static illumination field 20 has the minimum slit width $s_{min}$, while FIG. 3b illustrates how the maximum slit width $s_{max}$ is realized.

Figure 4:
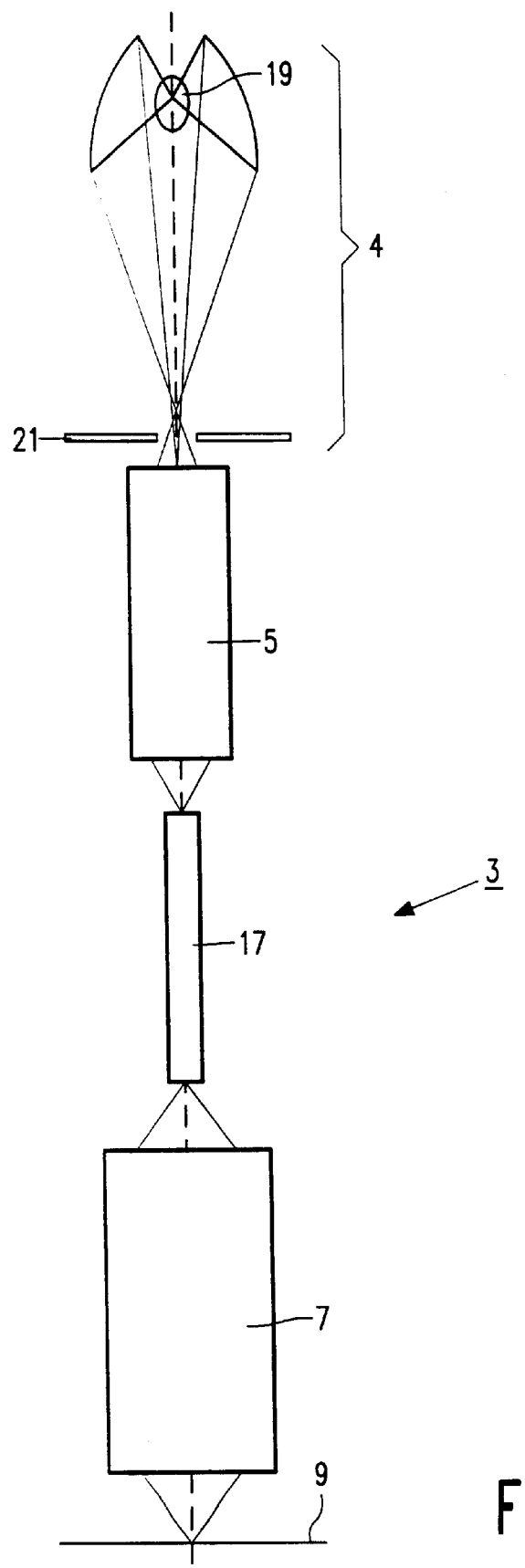
FIG. 4 shows, in detail, a second embodiment of a part of a photolithographic apparatus according to the invention.

FIG. 4 shows another embodiment of a part of an apparatus according to the invention with which it is also possible to realize the desired conditions for s and w. In this case, the optical waveguide 17 is implemented as a tunnel having walls which are movable relative to each other. In this way, the dimension perpendicular to the longitudinal direction of the tunnel and in the scanning direction can be adapted, hence also the slit width s of the illumination unit. The inner walls of the tunnel are provided with a reflective layer in order that the optical waveguide may also have an integrator function in this embodiment. The reflective layer may be formed, for example, by means of polished aluminium so that a reflection of more than 90% on the inner walls is obtained.

FIG. 5a is a cross-section taken in the longitudinal direction of the tunnel, showing an example of the way in which the minimum slit width of the static illumination field 20 can be realized. FIG. 5b shows an analogous example for the maximum slit width of the static illumination field 20.

As is apparent from the above-mentioned formulas, not only the slit width s but also the intensity I with which the slit is irradiated plays an important role in the time required to generate a given illumination dose. The desired illumination dose is determined, inter alia, by the material used for the photosensitive layer and the extent of the desired depth of focus which in its turn is determined by the nature of the pattern to be imaged.

The reason why it is important to know the illumination energy is different for a stepper and a scanner. In a stepper, the measured illumination energy defines the opening time of the shutter and hence the required illumination time. In a scanner, it is important that the illumination dose is uniform through the same field. There, the complete field is not illuminated simultaneously. The measurement of the illumination energy may subsequently be used to control the radiation source unit in such a way that the illumination dose is uniform within the same field.

An energy sensor is required for measuring the illumination dose supplied. In principle, such a sensor may be present at different locations in the apparatus. If the apparatus includes a REMA, it is preferred to perform the energy measurement between the radiation source unit and the REMA. If the energy sensor were arranged behind the REMA, as viewed from the radiation source unit, the sensor should have a very large dynamic range as a result of the different possible adjustments of the REMA at which a different quantity of light is transmitted.

In the embodiments shown in FIGS. 2 and 4, the energy sensor may be present, for example at the area of the optical waveguide 17.

Figure 6:
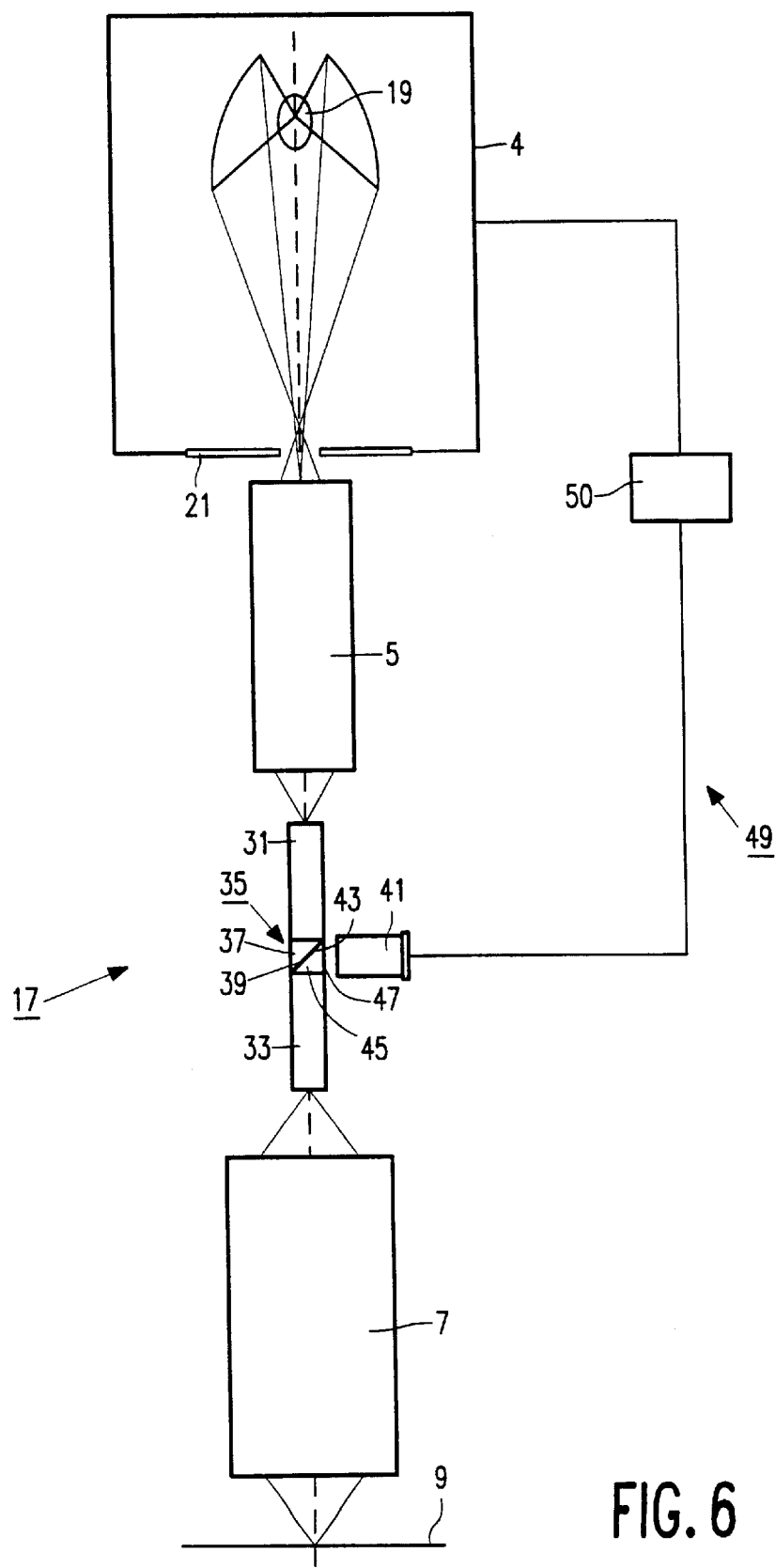
FIG. 6 shows diagrammatically an embodiment of a photolithographic apparatus according to the invention.

FIG. 6 shows diagrammatically an embodiment of a part of a photolithographic apparatus according to the invention, including also an energy sensor. In this case, the optical waveguide 17 is constituted by a first optically transparent bar 31 and a second optically transparent bar 33 enclosing a prism system 35. The prism system 35 may comprise, for example, two prisms 37, 45 whose hypotenuse sides 39, 43 are implemented in such a way that the coupling-out surface jointly constituted by the two hypotenuse sides is partly reflective and partly transmissive. This coupling-out surface couples light out of the main light path. In the example shown in the Figure, the reflection coefficient of the coupling-out surface is preferably only several % so that the main light path is not influenced or hardly influenced by the energy measurement.

The energy sensor 41 may be arranged, for example opposite the top face 47 of the second prism 45.

The radiation source unit may be controlled on the basis of the measured illumination dose in different manners. A first manner is to control the intensity of the light supplied by the radiation source by means of feedback circuit 49 by controlling, for example, the current at which the lamp is driven via a control unit 50. Another manner is to arrange an attenuator (not shown) having a variable transmission in the illumination unit in front of the energy sensor, viewed from the radiation source, with the transmission of the attenuator being determined and feedback-controlled by the measurement of the energy sensor.

The illumination in the illumination unit is preferably telecentric. In that case, the back-reflected light will reach the radiation source again, which will have a positive influence on the optical efficiency of the system. Moreover, if the optical waveguide is constituted by at least one optically transparent bar, the optical system preceding the optical waveguide is preferably confocal. This means that the radiation source is, for example, a lamp in combination with, for example, an elliptic mirror. The lamp should then be located in the first focus of the mirror, while the second focus of this mirror is located in the focal plane of the first optical system and the entrance face of the optical waveguide coincides with the backfocal plane of the first optical system. In this way it is achieved that light which is back-reflected by the diaphragm is refocused in the first focus of the elliptic mirror and is optimally recuperated.

If the optical waveguide is constituted by an optical tunnel, the light beam is preferably focused on the entrance face of the tunnel by the first optical system 5 in order to optimize the coupling of light into the tunnel.

Figure 7:
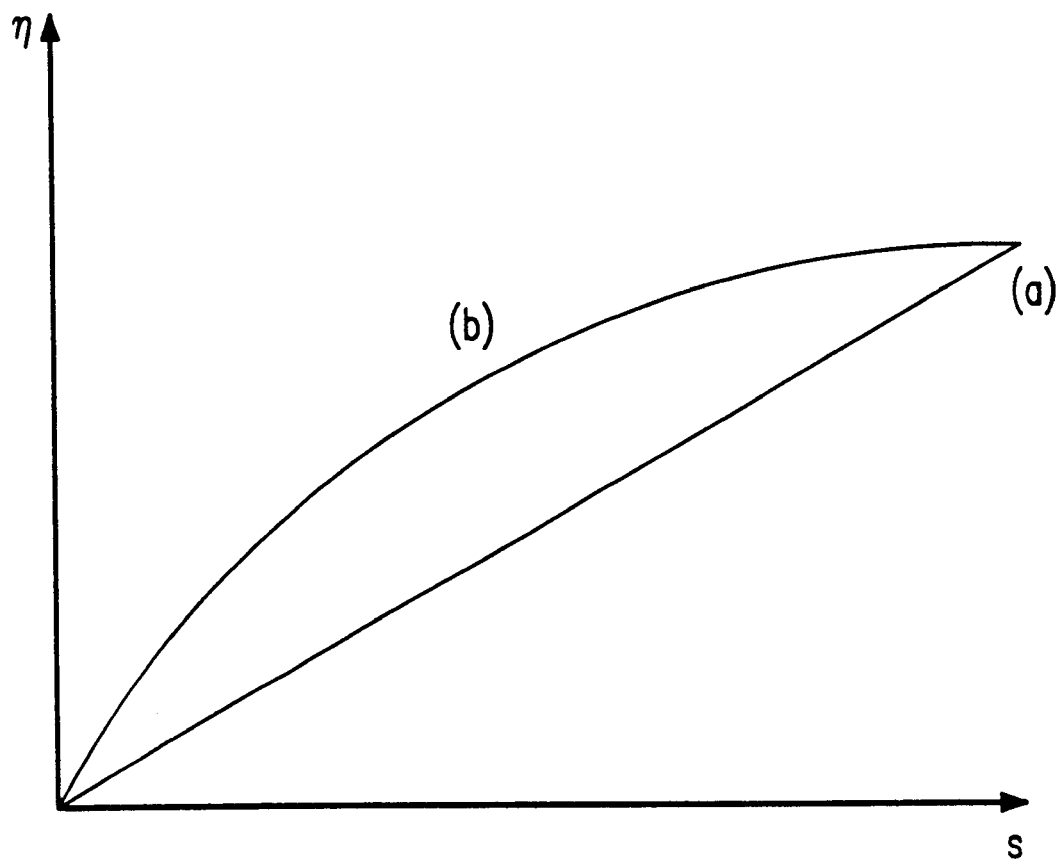
FIG. 7 shows a graph to illustrate the optical efficiency as a function of the slit width of the static illumination field, for a conventional system (a) and for a system having a variable slit width (b).

The graph in FIG. 7 shows the relation between the slit width s and the optical efficiency η for a conventional apparatus (a) and for an apparatus according to the invention (b).

A conventional apparatus is understood to mean an apparatus in which a slit-shaped illumination field is generated by blocking a part of the light beam, resulting in a considerable loss of energy in the illumination field.

In the embodiments described thus far, the optical waveguide comprises one or two optically transparent bars or an optical tunnel. All these elements have a light integrating function. The optical waveguide can, for example, also be constituted by a fly-eye integrator, by a combination of two fly-eye integrators, by a combination of a fly-eye integrator and an optically transparent bar or by a combination of a fly-eye integrator and an optical tunnel. For the description of optical waveguides of these types is referred to, for example, the U.S. Pat. No. 4,918,583.

What is claimed is:

1. A photolithographic method for imaging a mask pattern on a substrate, comprising:

providing a substrate which is at least partially covered by a layer of radiation-sensitive material;

providing a mask which contains a mask pattern;

producing illumination radiation having a preselected intensity;

projecting an image of at least part of the mask pattern onto a target area of the layer of radiation sensitive material using said illumination radiation;

generating a slit-shaped illumination field from said illumination radiation produced, said slit-shaped illumination field having a variable slit width; and concentrating substantially all the illumination radiation produced into said slit-shaped illumination field, wherein a value of energy of said illumination radiation within said slit-shaped illumination field is maintained substantially constant for all slit widths in a preselected photolithographic mode of operation.

2. A photolithographic method according to claim 1, wherein said generating a slit-shaped illumination field comprises using an optical tunnel having walls that are movable with respect to each other, and said concentrating comprises reflecting illumination radiation from said walls.

3. A photolithographic method for imaging a mask pattern on a substrate, comprising:

providing a substrate which is at least partially covered by a layer of radiation-sensitive material;

providing a mask which contains a mask pattern;

producing illumination radiation having a preselected intensity;

projecting an image of at least part of the mask pattern onto a target area of the layer of radiation sensitive material using said illumination radiation;

generating a slit-shaped illumination field from said illumination radiation produced, said slit-shaped illumination field having a variable slit width;

concentrating a first fraction of the illumination radiation produced into said slit-shaped illumination field;

recuperating a second fraction of illumination radiation other than illumination radiation of said first fraction; and concentrating said second fraction of illumination radiation into said slit-shaped illumination field, wherein a value of energy of said illumination radiation within said slit-shaped illumination field is maintained substantially constant for all slit widths in a preselected photolithographic mode of operation.

4. A photolithographic method according to claim 3, wherein said generating a slit-shaped illumination field comprises using a diaphragm having a variable slit width.

5. A photolithographic apparatus for imaging a mask pattern onto a substrate, comprising:

a radiation source;

a mask table disposed in a path of illumination radiation produced by said radiation source, said mask table comprising a mask holder adapted to hold a mask;

a substrate table disposed in said path of illumination radiation produced by said radiation source, said substrate table comprising a substrate holder adapted to hold said substrate;

a projection system disposed in said path of illumination radiation produced by said radiation source, said projection system constructed and arranged to image an irradiated portion of said mask onto a target portion of said substrate; and means for producing a slit-shaped static illumination field having a variable slit width within a preselected range of slit widths, wherein said means for producing a slit-shaped static illumination field produces a slit-shaped static illumination field having substantially constant energy irrespective of slit widths of said slit-shaped static illumination field.

6. A photolithographic apparatus according to claim 5, wherein said means for producing a slit-shaped static illumination field comprises an optical waveguide and a diaphragm disposed between said optical waveguide and said mask table, and said diaphragm defines an aperture that is substantially transparent to said illumination radiation, and wherein said diaphragm has a reflecting surface facing said waveguide, said reflecting surface of said diaphragm reflecting a portion of said illumination radiation back into said waveguide after said portion of illumination radiation has passed through said waveguide to said diaphragm.

7. A photolithographic apparatus according to claim 5, wherein said means for producing a slit-shaped static illumination field is an optical tunnel having walls that are movable with respect to each other, wherein inner surfaces of said walls of said optical tunnel are of a material that reflects said illumination radiation.

* * * * *